United States Patent
Kim et al.

(10) Patent No.: US 11,251,389 B2
(45) Date of Patent: Feb. 15, 2022

(54) QUANTUM DOT, QUANTUM DOT LIGHT EMITTING DIODE AND QUANTUM DOT DISPLAY DEVICE

(71) Applicant: LG DISPLAY CO., LTD., Seoul (KR)

(72) Inventors: Kyu-Nam Kim, Paju-si (KR); Hye-Li Min, Paju-si (KR); Min-Surk Hyung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/161,802

(22) Filed: Oct. 16, 2018

(65) Prior Publication Data
US 2019/0115550 A1 Apr. 18, 2019

(30) Foreign Application Priority Data
Oct. 16, 2017 (KR) .......................... 10-2017-0133837

(51) Int. Cl.
*H01L 51/50* (2006.01)
*H01L 51/52* (2006.01)
*H01L 27/32* (2006.01)

(52) U.S. Cl.
CPC ........ *H01L 51/502* (2013.01); *H01L 51/5036* (2013.01); *H01L 51/5206* (2013.01); *H01L 51/5221* (2013.01); *H01L 51/5237* (2013.01); *H01L 27/322* (2013.01); *H01L 27/3244* (2013.01)

(58) Field of Classification Search
CPC .............. H01L 51/502; H01L 51/5036; H01L 51/5206; H01L 51/5221; H01L 51/5237
See application file for complete search history.

(56) References Cited

U.S. PATENT DOCUMENTS

| 7,892,452 B2* | 2/2011 | Ryowa ................. C09K 11/025 |
| | | 252/301.4 R |
| 2005/0129947 A1* | 6/2005 | Peng ..................... B82Y 15/00 |
| | | 428/403 |
| 2007/0059527 A1 | 3/2007 | Jun et al. |

(Continued)

FOREIGN PATENT DOCUMENTS

| CN | 101835875 A | 9/2010 |
| CN | 104987860 A | 10/2015 |

(Continued)

OTHER PUBLICATIONS

Wood et al, "Alternating Current Driven Electroluminescence from ZnSe/ZnS:Mn/ZnS Nanocrystals", NanoLetters, vol. 9, No. 6, 2367-2371 (Year: 2009).*

(Continued)

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

A quantum dot, a quantum dot light emitting diode and a quantum dot display device are discussed. The quantum dot includes a first core including a first semiconductor material, a first shell positioned at an outer side of the first core and including a second semiconductor material, and a second core positioned between the first core and the first shell and including one of the first and second semiconductor materials and a doping metal.

21 Claims, 5 Drawing Sheets

(56) References Cited

U.S. PATENT DOCUMENTS

| | | | | |
|---|---|---|---|---|
| 2009/0087792 A1* | 4/2009 | Iizumi | .................... | H05B 33/10 |
| | | | | 430/312 |
| 2011/0291071 A1* | 12/2011 | Kim | ...................... | H01L 51/502 |
| | | | | 257/13 |
| 2012/0064134 A1 | 3/2012 | Bourke, Jr. et al. | | |
| 2014/0145150 A1* | 5/2014 | de Jong | .............. | H01L 27/3227 |
| | | | | 257/40 |
| 2014/0242631 A1 | 8/2014 | Yang et al. | | |

FOREIGN PATENT DOCUMENTS

| | | | | |
|---|---|---|---|---|
| CN | 106206977 A | 12/2016 | | |
| EP | 1363335 A2 * | 11/2003 | ........... | H01L 33/505 |
| JP | 2007-77010 A | 3/2007 | | |
| JP | 2011-505432 A | 2/2011 | | |
| KR | 10-1468985 B1 | 12/2014 | | |
| WO | WO 2004/066361 A2 | 8/2004 | | |

OTHER PUBLICATIONS

Choi et al., "Aqueous-phase synthesis and color-tuning of core/shell/shell inorganic nanocrystals consisting of ZnSe, (Cu, Mn)-doped ZnS, and ZnS", Journal of Alloys and Compounds, vol. 671, (2016), pp. 360 to 365, ISSN 0925-8388.

* cited by examiner

QUANTUM DOT, QUANTUM DOT LIGHT EMITTING DIODE AND QUANTUM DOT DISPLAY DEVICE

CROSS-REFERENCE TO RELATED APPLICATIONS

This application claims priority to and the benefit of Republic of Korea Patent Application No. 10-2017-0133837 filed in the Republic of Korea on Oct. 16, 2017, which is hereby incorporated by reference in its entirety.

BACKGROUND OF THE INVENTION

Field of the Invention

Embodiments of the invention relate to a quantum dot, and more particularly, to a quantum dot being capable of emitting white light, and a quantum dot light emitting diode and a quantum dot display device including the same.

Discussion of the Related Art

Since our society has entered into an information age, a field of display devices that represent all sorts of electrical signals as visual images has developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum dots (QD) in display devices has been researched and studied.

In the QD, an electron in an unstable state transitions from a conduction band to a valence band such that light is emitted. Since the QD has a high extinction coefficient and excellent quantum yield, strong fluorescent light can be emitted from the QD. In addition, since the wavelength of the light from the QD is controlled by a size of the QD, the entire visible light can be emitted by controlling the size of the QD.

FIG. 1 is a schematic view illustrating a related art QD 1.

As shown in FIG. 1, the QD 1 includes a core 10 and a shell 20. Generally, cadmium selenide (CdSe) is widely used for the core 10. The QD 1 including the CdSe core 10 has an advantage in color purity.

SUMMARY OF THE INVENTION

Accordingly, embodiments of the invention are directed to a QD, a QD light emitting diode and a QD display device including the same that substantially obviate one or more of the problems due to limitations and disadvantages of the related art, and have other advantages.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

Embodiments of the invention provide a quantum dot including a first core including a first semiconductor material, a first shell positioned at an outer side of the first core and including a second semiconductor material, and a second core positioned between the first core and the first shell and including one of the first and second semiconductor materials and a doping metal.

Embodiments of the invention also provide a quantum dot including a first core having a first energy band gap, a first shell positioned at an outer side of the first core and having a second energy band gap being larger than the first energy band gap, and a second core positioned between the first core and the first shell and having a third energy band gap being smaller than the first energy band gap.

Embodiments of the invention also provide a quantum dot light emitting diode including a first electrode; a second electrode facing the first electrode; and an emitting layer positioned between the first and second electrodes and including a quantum dot, the quantum dot comprising a first core including a first semiconductor material; a first shell positioned at an outer side of the first core and including a second semiconductor material; and a second core positioned between the first core and the first shell and including one of the first and second semiconductor materials and a doping metal.

Embodiments of the invention also provide a quantum dot light emitting diode including a first electrode; a second electrode facing the first electrode; and an emitting layer positioned between the first and second electrodes and including a quantum dot, the quantum dot comprising a first core having a first energy band gap; a first shell positioned at an outer side of the first core and having a second energy band gap being larger than the first energy band gap; and a second core positioned between the first core and the first shell and having a third energy band gap being smaller than the first energy band gap.

Embodiments of the invention also provide a quantum dot display device including a substrate; a quantum dot light emitting diode including a first electrode, a second electrode facing the first electrode, and an emitting layer positioned between the first and second electrodes and including a quantum dot, the quantum dot comprising a first core including a first semiconductor material, a first shell positioned at an outer side of the first core and including a second semiconductor material, and a second core positioned between the first core and the first shell and including one of the first and second semiconductor materials and a doping metal; and a thin film transistor between the substrate and the quantum dot light emitting diode and connected to the first electrode.

Embodiments of the invention also provide a quantum dot display device including a substrate; a quantum dot light emitting diode including a first electrode, a second electrode facing the first electrode, and an emitting layer positioned between the first and second electrodes and including a quantum dot, the quantum dot comprising a first core having a first energy band gap, a first shell positioned at an outer side of the first core and having a second energy band gap being larger than the first energy band gap, and a second core positioned between the first core and the first shell and having a third energy band gap being smaller than the first energy band gap; and a thin film transistor between the substrate and the quantum dot light emitting diode and connected to the first electrode.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

A white organic light emitting diode (W-OLED) display device, which provides a full-color image, includes a light emitting diode emitting white light and a color filter. Since the related art QD emits single wavelength light, all of an emitting stack of a red QD, an emitting stack of a green QD and an emitting stack of a blue QD are required when the related art QDs are used for the white QD light emitting diode (W-QLED) display device.

New QD of a dual-emission type is provided according to the embodiments of the present invention.

Reference will now be made in detail to embodiments of the invention, examples of which are illustrated in the accompanying drawings.

Figure 1:
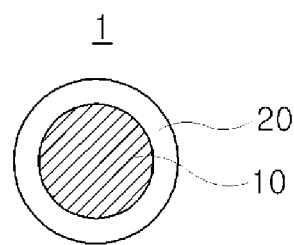
FIG. 1 is a schematic view illustrating the related art QD.
Figure 2:
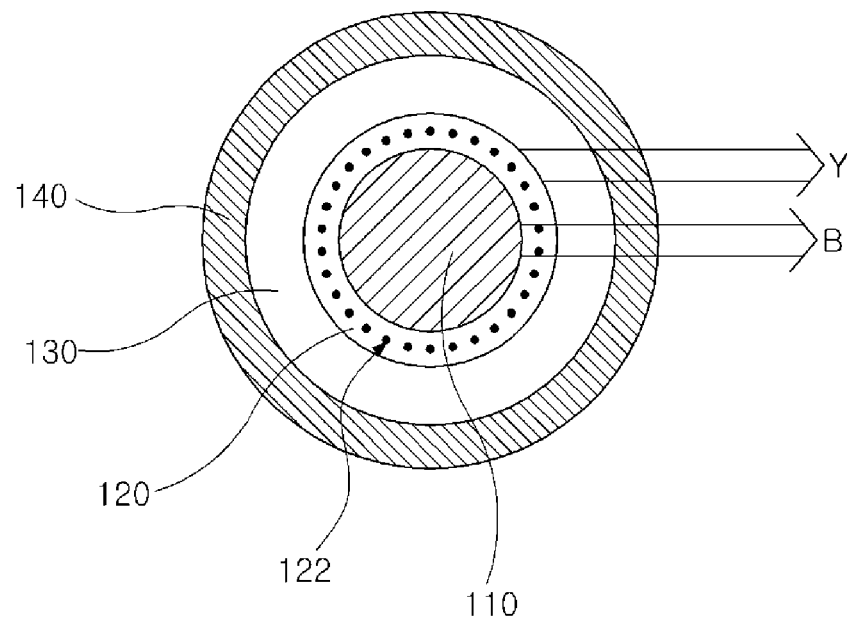
FIG. 2 is a schematic view illustrating a QD according to an embodiment of the present invention.
Figure 3:
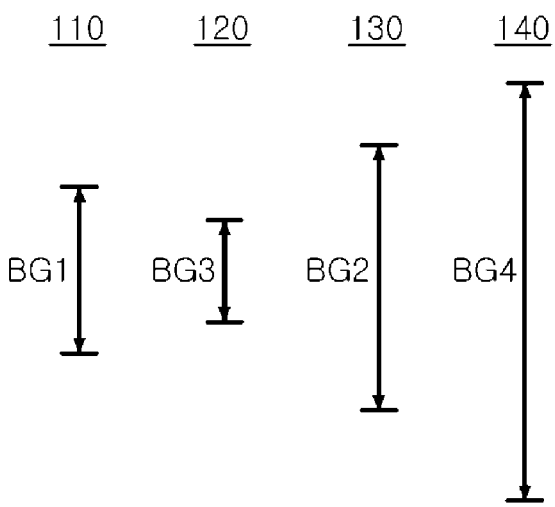
FIG. 3 is a view explaining an energy band gap in the QD of FIG. 2.

FIG. 2 is a schematic view illustrating a QD according to an embodiment of the present invention, and FIG. 3 is a view explaining an energy band gap in the QD of FIG. 2. All the components of the QD according to all embodiments of the present invention are operatively coupled and configured.

Referring to FIG. 2, a QD 100 according to an example of the present invention includes a first core (an inner core) 110, a second core (an outer core) 120 covering (or surrounding) the first core 110, a first shell (an inner shell) 130 covering the second core 120 and a second shell (an outer shell) 140 covering the first shell 130. Namely, the first core 110 is positioned in a center of the QD 100, and the first shell 130 is positioned at an outer side of the first core 110. The second core 120 is positioned between the first core 110 and the first shell 130, and the second shell 140 is positioned at an outer side of the first shell 130 such that the first shell 130 is positioned between the second core 120 and the second shell 140.

The QD 100 can further include a ligand combined at an outer surface of the second shell 140. However, the ligand may be omitted.

The first core 110 includes a first semiconductor material, and the first shell 130 includes a second semiconductor material. The second core 120 includes the first semiconductor material or the second semiconductor material, and a doping metal doped thereto.

The doping metal of the second core 120 has an energy band gap of about 1.95 to 2.75 eV. For example, at least one of a VII group metal, a XI group metal, a XII group metal and a XIII group metal in the periodic table can be used as the doping metal. The doping metal can be at least one of Al, Mn, Cu, Ga and In.

For example, the first core 110 can include ZnSe, the first shell 130 can include ZnSeS, and the second core 120 can include ZnSe doped by the doping metal (M), i.e., M:ZnSe, or ZnSeS doped by the doping metal (M), i.e., M:ZnSeS.

The second shell 140 can include a third semiconductor material such as ZnS. An emitting efficiency (a quantum efficiency) of the QD 100 is increased by the second shell 140. The second shell 140 can be omitted.

Referring to FIG. 3, the first core 110 has a first energy band gap "BG1", and the first shell 130 has a second energy band gap "BG2" being larger than the first core 110. Namely, the second energy band gap "BG2" is larger than first energy band gap "BG1". Accordingly, the blue light is emitted from the first core 110.

The second core 120 has a third energy band gap "BG3" being smaller than the first core 110. Namely, the third energy band gap "BG3" is smaller than the first energy band gap "BG1". Accordingly, an energy from the first core 110 is transferred into the second core 120 such that the yellow light is emitted from the second core 120. In other words, the blue light from the first core 110 is partially absorbed in the second core 120 such that the second core 120 emits the yellow light.

For example, the first core 110 can include ZnSe and has the energy band gap of about 3.0 to 3.66 eV, and the second core 120 can include Al:ZnSeS (Al doping ratio: about 4 wt %) and has the energy band gap of about 2.35 to 3.0 eV.

Namely, in the QD of the present invention, the blue light from the first core 110 and the yellow light from the second core 120 are mixed such that the white light is provided (or emitted) from the QD 100.

The second shell 140 has a fourth energy band gap "BG4" being larger than the second energy band gap "BG2" of the first shell 130 such that the quantum efficiency of the QD 100 is improved. As mentioned above, the second shell 140 can be omitted.

In the QD 100 of the present invention, since the doping metal, which is capable of decreasing an energy band gap, is doped into the second core 120, the QD 100 emits the white light.

When the doping metal is doped into the first core 110 or both of the first and second cores 110 and 120, the QD only emits the yellow light without the blue light. In addition, without the doping metal, the QD only emits the blue light without the yellow light.

Namely, as described in the present disclosure, to provide the white light from single QD 100, in an example the QD 100 should preferably include the second core 120, where the doping metal should be doped to have lower energy band gap than the first core 110, at an outer side of the first core 110.

Synthesis of QD

To provide a QD according to an example of the present invention, Zn acetate (0.073 g, 0.4 mmol), oleic acid (0.237 g, 0.82 mmol) and Se (0.064 g, 0.8 mmol), octadecene (26 ml) were put into the three-neck flask and heated under the temperature of 120° C. and the vacuum condition for 2 hrs.

Under N2 condition, the mixture was heated under the temperature of 300° C. for 1 hr and cooled into the room temperature. Next, Al olate (0.034 g, 0.04 mmol) were added, and the mixture was stirred for 20 minutes.

Zn olate (0.75 g, 1.2 mmol) and 1M TBP-S (1.2 ml) were added. The mixture was heated under the temperature of 280° C. for 1 hr and cooled into the room temperature. (TBP=tributyl phosphate)

Zn acetate (2.21 g, 1.2 mmol) and dodecanethiol (0.5 ml, 2.8 mmol) were added. Under N2 condition, the mixture was heated under the temperature of 230° C. for 2 hrs and cooled into the room temperature.

After the mixture was dispersed in toluene (5 ml), acetone (40 ml) was added. By 4 times centrifugation, a QD of ZnSe/Al:ZnSeS/ZnSeS/ZnS was obtained.

Figure 4:
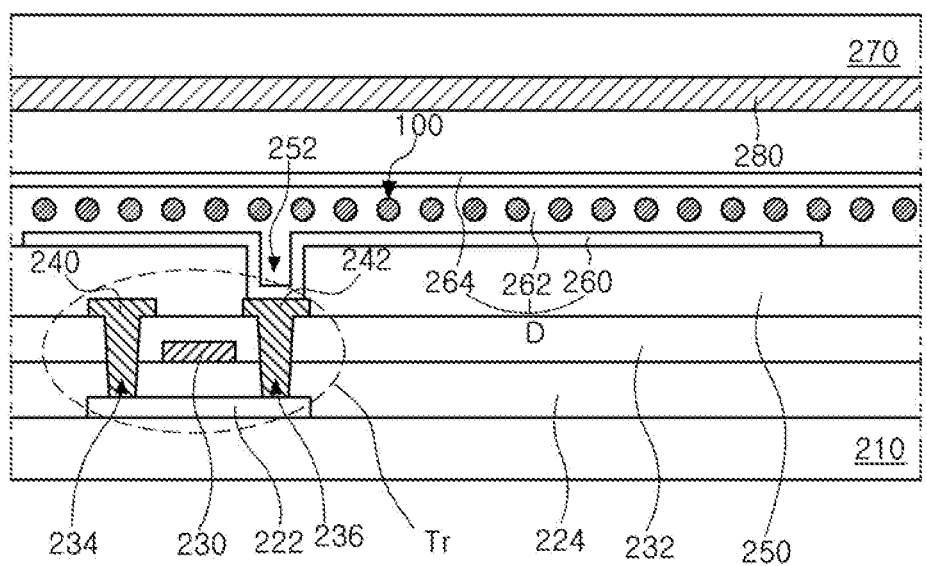
FIG. 4 is a schematic view illustrating a QD display device according to an embodiment of the present invention.
Figure 5:
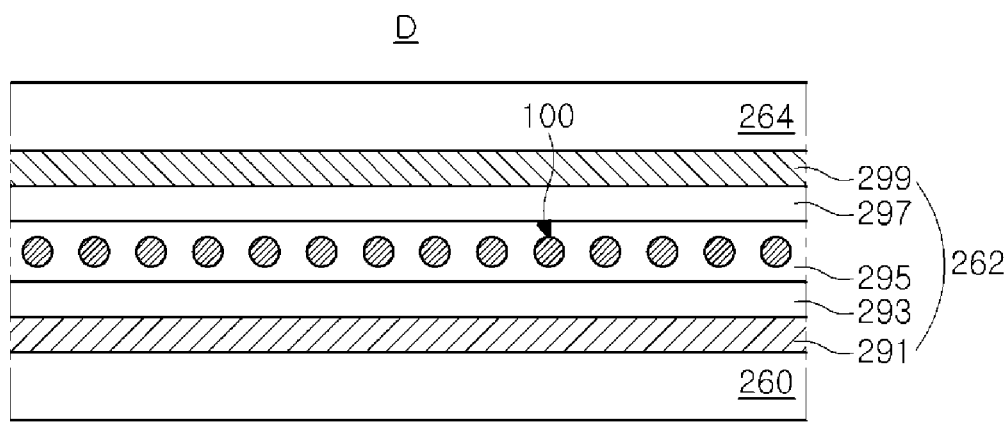
FIG. 5 is a schematic view illustrating a QD light emitting diode according to an embodiment of the present invention.
Figure 6A:
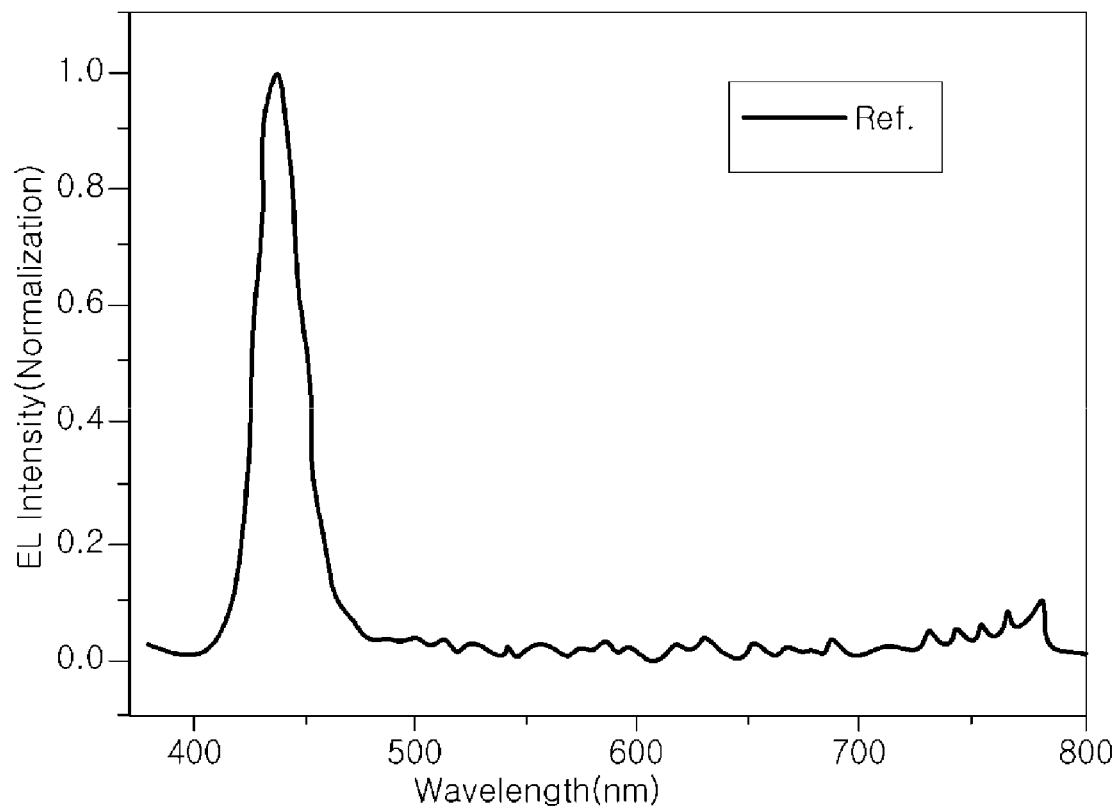
FIGS. 6A to 6C are graphs showing an emission peak according to a weight ratio of a doping metal in the QD.
Figure 6B:
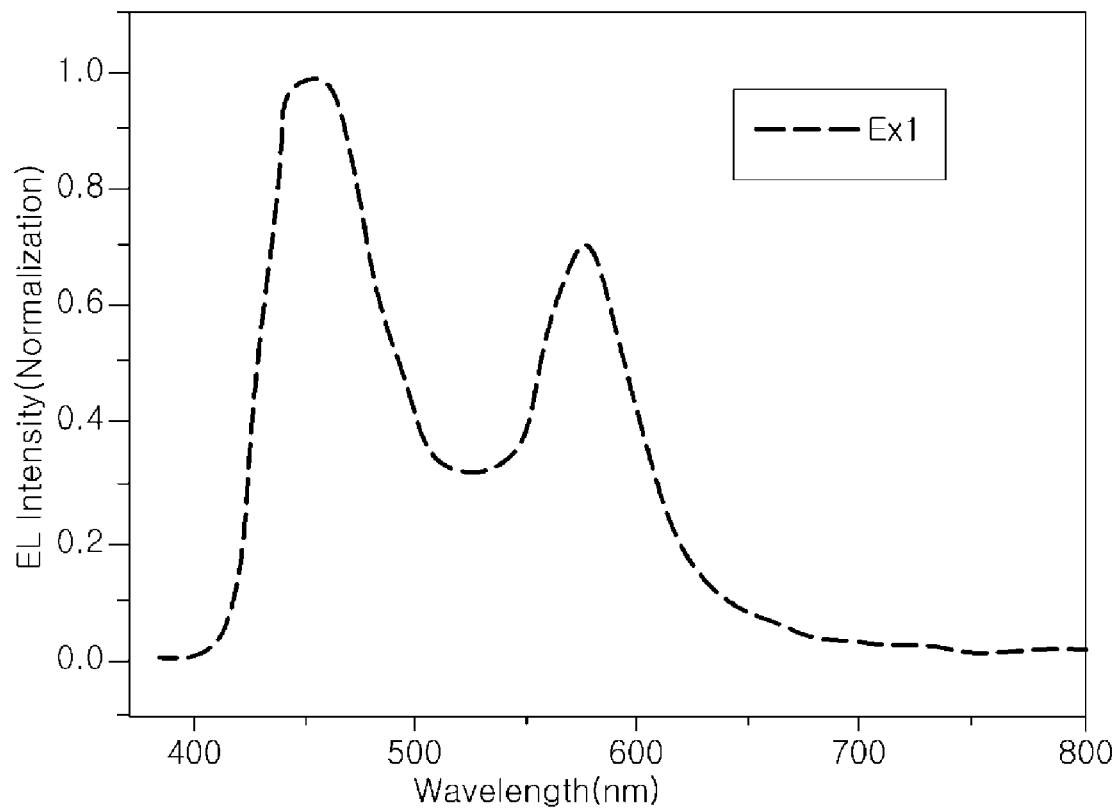
Figure 6C:
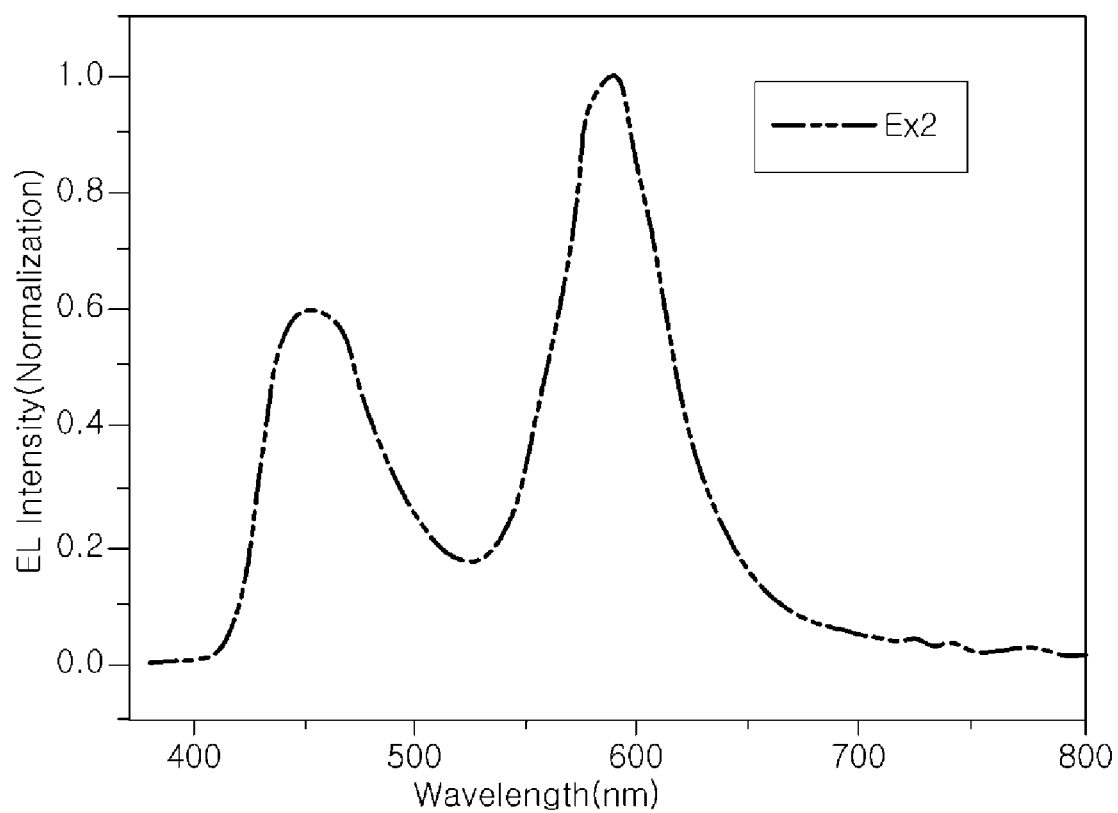

FIG. 4 is a schematic view illustrating a QD display device according to an embodiment of the present invention, and FIG. 5 is a schematic view illustrating a QD light emitting diode according to an embodiment of the present invention. FIGS. 6A to 6C are graphs showing an emission peak according to a weight ratio of a doping metal in the examples of a QD. All the components of the QD display device and the QD light emitting diode according to all embodiments of the present invention are operatively coupled and configured.

As shown in FIG. 4, a QD display device 200 of the present invention includes a first substrate 210, a driving element Tr on or over the first substrate 210 and a QD light emitting diode D connected to the driving element Tr.

A semiconductor layer 222 is formed on the first substrate 210. The semiconductor layer 222 can include an oxide semiconductor material or polycrystalline silicon.

When the semiconductor layer 222 includes the oxide semiconductor material, a light-shielding pattern can be formed under the semiconductor layer 222. The light to the semiconductor layer 222 is shielded or blocked by the light-shielding pattern such that thermal degradation of the semiconductor layer 222 can be prevented. On the other hand, when the semiconductor layer 222 includes polycrystalline silicon, impurities can be doped into both sides of the semiconductor layer 222.

A gate insulating layer 224 is formed on the semiconductor layer 222. The gate insulating layer 224 can be formed of an inorganic insulating material such as silicon oxide or silicon nitride.

A gate electrode 230, which is formed of a conductive material, e.g., metal, is formed on the gate insulating layer 224 to correspond to a center of the semiconductor layer 222.

An interlayer insulating layer 232, which is formed of an insulating material, is formed on an entire surface of the first substrate 210 including the gate electrode 230. The interlayer insulating layer 232 can be formed of an inorganic insulating material, e.g., silicon oxide or silicon nitride, or an organic insulating material, e.g., benzocyclobutene or photo-acryl.

The interlayer insulating layer 232 includes first and second contact holes 234 and 236 exposing both sides of the semiconductor layer 222. The first and second contact holes 234 and 236 are positioned at both sides of the gate electrode 230 to be spaced apart from the gate electrode 230.

A source electrode 240 and a drain electrode 242, which are formed of a conductive material, e.g., metal, are formed on the interlayer insulating layer 232.

The source electrode 240 and the drain electrode 242 are spaced apart from each other with respect to the gate electrode 230 and respectively contact both sides of the semiconductor layer 222 through the first and second contact holes 234 and 236.

The semiconductor layer 222, the gate electrode 230, the source electrode 240 and the drain electrode 242 constitute the TFT as a driving element Tr.

In FIG. 4, the gate electrode 230, the source electrode 240, and the drain electrode 242 are positioned over the semiconductor layer 222. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

A gate line and a data line are disposed on or over the first substrate 210 and cross each other to define a pixel region. In addition, a switching element, which is electrically connected to the gate line and the data line, can be disposed on the first substrate 210. The switching element is electrically connected to the TFT Tr as the driving element.

In addition, a power line, which is parallel to and spaced apart from the gate line or the data line, can be formed on or over the first substrate 210. Moreover, a storage capacitor for maintaining a voltage of the gate electrode 230 of the TFT Tr during one frame, can be further formed on the first substrate 210.

A passivation layer 250, which includes a drain contact hole 252 exposing the drain electrode 242 of the TFT Tr, is formed to cover the TFT Tr.

A first electrode 260, which is connected to the drain electrode 242 of the TFT Tr through the drain contact hole 252, is separately formed in each pixel region. The first electrode 260 can be an anode and can be formed of a conductive material having a relatively high work function. For example, the first electrode 260 can be formed of a transparent conductive material such as indium-tin-oxide (ITO) or indium-zinc-oxide (IZO).

When the QD display device 200 is operated in a top-emission type, a reflection electrode or a reflection layer can be formed under the first electrode 260. For example, the reflection electrode or the reflection layer can be formed of aluminum-palladium-copper (APC) alloy.

An emitting layer 262 including a QD 100 (e.g., the QD 100 of FIG. 2) is formed on the first electrode 260, and a second electrode 264 is formed over the first substrate 210 including the emitting layer 262. The second electrode 264 covers an entire surface of a display region and can be formed of a conductive material having a relatively low work function to serve as a cathode. For example, the second electrode 264 can be formed of aluminum (Al), magnesium (Mg) or Al—Mg alloy.

The first electrode 260, the emitting layer 262 and the second electrode 264 constitute the QD light emitting diode D.

A second substrate 270 is disposed over the QD light emitting diode D to face the first substrate 210. In addition, a color filter 280 is formed on an inner side of the second substrate 270. Namely, the color filter 280 is positioned between the QD light emitting diode D and the second substrate 270.

Alternatively, the color filter 280 can be positioned between the first substrate 210 and the QD light emitting diode D.

Namely, a position of the color filter 280 is determined depending on whether the QD light emitting diode D is a top-emission type or a bottom-emission type.

In addition, an encapsulation layer can be further formed between the QD light emitting diode D and the color filter 280 to cover the QD light emitting diode D. For example, the moisture penetration into the QD light emitting diode D can be blocked by the encapsulation layer.

Referring to FIG. 5, the emitting layer 262 includes an emitting material layer (EML) 295 between the first and second electrodes 260 and 264. The EML 295 includes the QD 100.

In addition, the emitting layer 262 can further include a hole transporting layer (HTL) 293 between the first electrode 260 and the EML 295, a hole injection layer (HIL) 291 between the first electrode 260 and the HTL, an electron transporting layer (ETL) 297 between the EML 295 and the second electrode 264, and an electron injection layer (EIL) 299 between ETL 297 and the second electrode 264.

The emitting layer 262 covers an entire surface of the display region.

Referring to FIG. 2, the QD 100 includes the first core 110, the second core 120 covering the first core 110 and the first shell 130 covering the second core 120, and the doping metal is doped into the second core 120 such that the second core 120 has an energy band gap being smaller than the first core 110. Accordingly, the QD 100 can provide the white light by the blue light from the first core 110 and the yellow light from the second core 120.

In the embodiment(s) of the present invention, the white QD light emitting diode (W-QLED) having a single emitting layer is provided by using the QD 100, and the QD display device 200 providing a color image is provided by using the color filter.

In contrast, according to the related art light emitting diode, the W-QLED can be provided with at least two emission stacks of a blue emission stack and a yellow emission stack. Accordingly, the production cost and the thickness of the display device increase.

To address these limitations associated with the related art light emitting diode, the QD display device 200 in the example of the present invention includes the QD 100, which provides the white light by using the blue light from the first core 110 and the yellow light from the second core 120, the W-QLED type QD display device 200 is provided with single emission stack.

Accordingly, there are advantages in the production cost and the thickness of the QD light emitting diode and the QD display device in the examples of the present invention.

QD Light Emitting Diode

According to an example of the present invention, the anode, the HIL, the HTL, the EML, the ETL and the cathode in Table 1 are sequentially formed to form the QD light emitting diode. (PEDOT: poly(3,4-ethylenedioxythiophene) polystyrene sulfonate, TFB: Poly[(9,9-dioctylfluorenyl-2,7-diyl)-co-(4,4'-(N-(4-sec-butylphenyl) diphenylamine)])

TABLE 1

|  | anode | HIL | HTL | EML | ETL | cathode |
|---|---|---|---|---|---|---|
| Material | Al | PEDOT | TFB | QD | ZnO | ITO |
| thickness [Å] | 510 | 280 | 340 | 250 | 560 | 490 |

The QD used in the QD light emitting diode in the example of the present invention has a structure of ZnSe/Al:ZnSeS/ZnSeS/ZnS. The properties of the QD light emitting diode are measured with changing a doping ratio of Al into the second core and are listed in Table 2. The electroluminescent intensity (EL intensity) according to the wavelength is shown in FIGS. 6A to 6C. In Table 2, the weight % of Al is a feeding ratio of Al in the synthesis of the QD.

TABLE 2

|  | QD | EQE % (10J) | $L_{Max}$ [nit] | Vth | Wp [nm] | CIE (x, y) |
|---|---|---|---|---|---|---|
| Ref | Al 0% | 0.23 | 1638 | 2.34 | 442 | 0.17, 0.028 |
| Ex1 | Al 10% | 0.24 | 2334 | 2.22 | 452, 574 | 0.28, 0.29 |
| Ex2 | Al 20% | 0.15 | 865 | 3.13 | 451, 585 | 0.41, 0.39 |

The QD without Al doping is used in the reference (Ref), and the QD with Al doping is used in the examples 1 and 2 (Ex1 and Ex2). For example, when the feeding ratio of Al is about 10 weight % as the example 1, Al has a weight % of about 4 in the second core.

As shown in Table 2 and FIG. 6A, the QD light emitting diode using the QD without Al doping emits the blue light.

On the other hand, as shown in Table 2 and FIGS. 6B and 6C, the QD light emitting diode using the QD with Al-doped second core emits the white light. However, as the doping ratio of Al is increased, the emission efficiency of the QD is decreased and the yellow-shift problem of the light is generated.

When the color purity and the emission efficiency are considered, it is preferred that the weight % of Al in the second core 120 can be about 2 to 10. However, it is not limited thereto.

As shown in FIGS. 6B and 6C, a first wavelength light (i.e., the blue light) is emitted from the first core 110, and a second wavelength light (i.e., the yellow light) is emitted from the second core 120. The intensity of each of the first wavelength light and the second wavelength light is controlled or determined by the amount of the metal doped into the second core 120. In other words, the intensity of each of the first wavelength light and the second wavelength light depends on the doping ratio of the metal doped into the second core 120

Namely, as shown in FIG. 6B, when the metal is doped with a first doping ratio (or doping amount), the first wavelength light has a first intensity and the second wavelength light has a second intensity being smaller than the first intensity. On the other hand, as shown in FIG. 6C, when the metal is doped with a second doping ratio being larger than the first doping ratio, the first wavelength light has a third intensity and the second wavelength light has a fourth intensity being larger than the third intensity.

In other words, the energy band gap of the second core is changed according to the doping ratio of the metal into the second core, and the intensity of each of the first wavelength light from the first core and the second wavelength light from the second core is changed according to the doping ratio of the metal into the second core.

As mentioned above, the QD 100 includes the first core 110, the second core 120 covering the first core 110 and the first shell 130 covering the second core 120, and the doping metal is doped into the second core 120 such that the second core 120 has an energy band gap being smaller than the first core 110. Accordingly, the QD 100 can provide the white light by the blue light from the first core 110 and the yellow light from the second core 120.

In addition, by using the QD 100, the white-QD light emitting diode D and the QD display device 200 with low production cost and simple structure are provided.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A quantum dot, comprising:
   a first core including a first semiconductor material;
   a first shell positioned at an outer side of the first core, and including a second semiconductor material; and
   a second core positioned between the first core and the first shell, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

2. The quantum dot according to claim 1, further comprising a second shell surrounding at an outer side of the first shell and including a third semiconductor material.

3. The quantum dot light emitting diode according to claim 2, wherein the first shell surrounds the outer side of the second core, wherein the second core surrounds the first core, and wherein the second shell includes ZnS.

4. The quantum dot according to claim 1, wherein the blue light has the first intensity and the yellow light has the second intensity being smaller than the first intensity when doping ratio is decreased.

5. The quantum dot according to claim 1, wherein the weight % of Al in the second core is 4.

6. The quantum dot according to claim 1, wherein the first core has an energy band gap of about 3.0 to 3.66, and the second core has an energy band gap of about 2.35 to 3.0 eV.

7. The quantum dot according to claim 6, wherein Al as a doping metal in the second core has an energy band gap that is less than the energy band gap of the first core.

8. The quantum dot according to claim 7, wherein Al as the doping metal has the energy band gap of about 1.95 to 2.75 eV.

9. A quantum dot, comprising:

a first core having a first energy band gap;

a first shell positioned at an outer side of the first core and having a second energy band gap being larger than the first energy band gap; and a second core positioned between the first core and the first shell and having a third energy band gap being smaller than the first energy band gap, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

10. The quantum dot according to claim 9, further comprising a second shell surrounding an outer side of the first shell and having a. fourth energy band gap being larger than the second energy band gap.

11. A quantum dot light emitting diode, comprising:

a first electrode;

a second electrode facing the first electrode; and an emitting layer positioned between the first and second electrodes and including a quantum dot, the quantum dot comprising:

a first core including a first semiconductor material;

a first shell positioned at an outer side of the first core, and including a second semiconductor material; and a second core positioned between the first core and the first shell, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

12. The quantum dot light emitting diode according to claim 11, wherein the weight % of Al in the second core is 4.

13. The quantum dot light emitting diode according to claim 11, wherein the emitting layer includes a plurality of quantum dots, and wherein each quantum dot individually emits white light.

14. A quantum dot light emitting diode, comprising:

a first electrode;

a second electrode facing the first electrode; and an emitting layer positioned between the first and second electrodes and including a quantum dot, the quantum dot comprising:

a first core having a first energy band gap;

a first shell positioned at an outer side of the first core and having a second energy band gap being larger than the first energy band gap; and a second core positioned between the first core and the first shell and having a third energy band gap being smaller than the first energy band gap, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

15. A quantum dot display device, comprising:

a substrate:

a quantum dot light emitting diode including a first electrode, a second electrode facing the first electrode, and an emitting layer positioned between the first and second electrodes and including a quantum dot, the quantum dot comprising:

a first core including a first semiconductor material, a first shell positioned at an outer side of the first core and including a second semiconductor material, and a second core positioned between the first core and the first shell; and a thin film transistor between the substrate and the quantum dot light emitting diode and connected to the first electrode, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

16. The quantum dot display device according to claim 15, further comprising a color filter positioned between the substrate and the quantum dot light emitting diode or over the quantum dot light emitting diode.

17. The quantum dot display device according to claim 16, further comprising an encapsulation layer disposed between the quantum dot light emitting diode and the color filter to cover the quantum dot light emitting diode.

18. The quantum dot display device according to claim 15, wherein the weight % of Al in the second core is 4.

19. A quantum dot display device, comprising:

a substrate;

a quantum dot light emitting diode including a first electrode, a second electrode facing the first electrode, and an emitting layer positioned between the first and second electrodes and including a quantum dot, the quantum dot comprising:

a first core having a first energy band gap, a first shell positioned at an outer side of the first core and having a second energy band gap being larger than the first energy band gap, and a second core positioned between the first core and the first shell and having a third energy band gap being smaller than the first energy band gap; and a thin film transistor between the substrate and the quantum dot light emitting diode and connected to the first electrode, wherein the first core includes ZnSe, the first shell includes ZnSeS, and the second core includes Al-doped ZnSeS, wherein a weight % of Al in the second core is 2 to 10, wherein a thickness of the second core is smaller than each of a thickness of the first core and a thickness of the first shell, wherein a blue light and a yellow light are respectively emitted from the first core and the second core so that a white light is emitted from the quantum dot, wherein a first intensity of the blue light from the first core and a second intensity of the yellow light from the second core depend on a doping ratio of Al in the second core, and wherein the second intensity increases relative to the first intensity as the doping ratio is increased.

20. The quantum dot display device according to claim 19, further comprising a color filter positioned between the substrate and the quantum dot light emitting diode or over the quantum dot light emitting diode.

21. The quantum dot display device according to claim 20, further comprising an encapsulation layer disposed between the quantum dot light emitting diode and the color filter to cover the quantum dot light emitting diode.

* * * * *